United States Patent
Srinivasan et al.

[19]

[11] Patent Number: 6,148,364
[45] Date of Patent: Nov. 14, 2000

[54] METHOD AND APPARATUS FOR CASCADING CONTENT ADDRESSABLE MEMORY DEVICES

[75] Inventors: Varadarajan Srinivasan, Los Altos Hills; Bindiganavale S. Nataraj, Cupertino; Sandeep Khanna, Santa Clara, all of Calif.

[73] Assignee: NetLogic Microsystems, Inc., Mountain View, Calif.

[21] Appl. No.: 09/001,110

[22] Filed: Dec. 30, 1997

[51] Int. Cl.$^7$ .................................................... G06F 12/02
[52] U.S. Cl. ................................ 711/108; 380/9; 380/5; 365/49; 365/226
[58] Field of Search ........................... 380/9, 5; 711/108; 365/49, 226

[56] References Cited

U.S. PATENT DOCUMENTS 3,257,646  6/1966  Roth .
3,353,159  11/1967  Lee, III .

(List continued on next page.)

FOREIGN PATENT DOCUMENTS 0 660 332  12/1993  European Pat. Off. .
08167295   6/1996   Japan .

OTHER PUBLICATIONS

Masao Akata, "A Scheduling Content–Addressable Memory for ATM Space–Division Switch Control", IEEE International Solid State Circuits Conference, Feb. 1991, New York.

Ghose et al., "Response Pipelined CAM Chips: The First Generation and Beyond", 7$^{th}$ International conference on VLSI Design, Jan. 1994, pp. 365–368.

Music Semiconductors, "MU9C1480 LANCAM" Advanced Information, Mar. 22, 1990, pp. 1–11.

Music Semiconductors, "MU9C1480 LAMCAM™" Preliminary Specification, Jan. 15, 1991, Rev. O, pp. 1 page total.

Motorola Semiconductor Technical Data, "Advance Information 16K ×64 CAM" MCM69C432, Jan. 1996, pp. 4 pages total.

GEC Plessey Semiconductors, "P2800 Multi–port Content Addressable Memory Functional Product Specification GPS–FPS–2800–12", Jan. 1996, pp. 1–102.

Advanced Micro Devices, "Final Am99C10A 256 ×48 Content Addressable Memory" Publication No. 08125, Rev. G, Dec. 1992, pp. 1–21.

(List continued on next page.)

*Primary Examiner*—B. James Peikari
*Attorney, Agent, or Firm*—Blakely, Sokoloff, Taylor & Zafman

[57] ABSTRACT

A method and apparatus for cascading content addressable memory (CAM) devices is disclosed. The method and apparatus may be particularly useful when depth cascading CAM devices that operate in a flow-through mode. In the flow-through mode, a compare instruction may be simultaneously provided to each CAM device in the cascade, and the match address, data stored at the matched location, or other status information may then be output to a common output data bus by the highest priority matching CAM device in the same cycle that the instruction is provided to the CAM devices. Each CAM device may have a cascade input and a cascade output to perform the cascade function. The cascade output of a higher priority CAM device may be connected to the cascade input of the next lower priority CAM device. The higher priority CAM device may assert a cascade signal on its cascade output at a predetermined time after receiving an input signal (e.g., a clock signal). Asserting the cascade signal may indicate that the higher priority CAM device has completed the compare instruction. When the lower priority CAM device detects that the cascade signal has been asserted on its cascade input, the lower priority CAM device may sample the match flag of the higher priority CAM device to determine if the lower priority CAM device may output its data to the common output data bus.

31 Claims, 9 Drawing Sheets

U.S. PATENT DOCUMENTS

| | | | |
|---|---|---|---|
| 3,602,899 | 8/1971 | Lindquist et al. . | |
| 3,675,211 | 7/1972 | Raviv . | |
| 3,685,020 | 8/1972 | Meade . | |
| 3,705,390 | 12/1972 | Mundy | 365/49 |
| 3,868,642 | 2/1975 | Sachs . | |
| 4,112,502 | 9/1978 | Scheuneman . | |
| 4,244,033 | 1/1981 | Hattori . | |
| 4,472,805 | 9/1984 | Wacyk et al. . | |
| 4,523,301 | 6/1985 | Kadota et al. | 365/49 |
| 4,646,271 | 2/1987 | Uchiyama et al. | 365/49 |
| 4,656,626 | 4/1987 | Yudichak et al. . | |
| 4,670,858 | 6/1987 | Almy | 365/49 |
| 4,747,080 | 5/1988 | Yamada | 365/200 |
| 4,758,982 | 7/1988 | Price . | |
| 4,780,845 | 10/1988 | Threewitt | 365/49 |
| 4,785,398 | 11/1988 | Joyce et al. . | |
| 4,791,606 | 12/1988 | Threewitt et al. | 365/49 |
| 4,813,002 | 3/1989 | Joyce et al. | 365/49 |
| 4,845,668 | 7/1989 | Sano et al. | 365/49 |
| 4,903,234 | 2/1990 | Sakuraba et al. | 365/49 |
| 4,928,260 | 5/1990 | Chuang et al. | 365/49 |
| 4,958,377 | 9/1990 | Takahashi . | |
| 4,959,811 | 9/1990 | Szcepanek | 365/49 |
| 4,975,873 | 12/1990 | Nakabayashi et al. | 365/49 |
| 4,996,666 | 2/1991 | Duluk, Jr. | 365/49 |
| 5,010,516 | 4/1991 | Oates | 365/49 |
| 5,014,195 | 5/1991 | Farrell et al. . | |
| 5,036,486 | 7/1991 | Noguchi et al. | 365/49 |
| 5,051,948 | 9/1991 | Watabe et al. | 365/49 |
| 5,053,991 | 10/1991 | Burrows | 365/49 |
| 5,107,501 | 4/1992 | Zorian . | |
| 5,111,427 | 5/1992 | Kobayashi et al. | 365/49 |
| 5,226,005 | 7/1993 | Lee et al. | 365/49 |
| 5,265,100 | 11/1993 | McClure et al. . | |
| 5,267,213 | 11/1993 | Sung et al. | 365/226 |
| 5,383,146 | 1/1995 | Threewitt | 365/49 |
| 5,414,704 | 5/1995 | Spinney . | |
| 5,440,709 | 8/1995 | Edgar . | |
| 5,454,094 | 9/1995 | Montoye . | |
| 5,455,576 | 10/1995 | Clark, II et al. . | |
| 5,469,161 | 11/1995 | Bezek . | |
| 5,469,378 | 11/1995 | Albon et al. | 365/49 |
| 5,485,418 | 1/1996 | Hiraki et al. | 365/49 |
| 5,490,102 | 2/1996 | Jubran | 365/49 |
| 5,491,703 | 2/1996 | Barnaby et al. . | |
| 5,513,134 | 4/1996 | Cooperman et al. | 365/49 |
| 5,517,441 | 5/1996 | Dietz et al. | 365/49 |
| 5,621,677 | 4/1997 | Jones | 365/49 |
| 5,649,149 | 7/1997 | Stormon et al. | 711/108 |
| 5,706,224 | 1/1998 | Srinivasan et al. | 365/49 |
| 5,841,874 | 11/1998 | Kempke et al. | 380/50 |
| 5,860,085 | 1/1999 | Stormon et al. | 711/108 |
| 5,930,359 | 7/1999 | Kemple et al. | 380/9 |

OTHER PUBLICATIONS

Music Semiconductors, "MU9C2480 LANCAM Preliminary Data Sheet", Aug. 25,1995, pp. 1–24.

GEC Plessey Semiconductors Preliminary Information, "P2800 2K ×64 BIt Multi–Port Content Addressable Memory", Feb. 1997, pp. 1–15.

Music Semiconductor, The MU9C1480 LANCAM Handbook, Rev. 3, Nov. 1994, pp. 1–1 through 7–12.

Soo–Ik Chae, et al., "Content–Addressable Memory for VLSI Pattern Inspection", IEEE Journal of Solid–State Circuits, vol. 23, No. 1, Feb. 1988, pp.74–78.

Yong–Chul Shin et al., "A Special–Purpose Content Addressabel Memory Chip for Real–Time Image Processing", IEEE Journal of Solid State Circuits, vol. 27, No. 5, May 1992, pp. 737–744.

Sergio R. Ramirez–Chavez, "Encoding Don't Cares in Static and Dynamic Content–Addressable Memories", Transactions Briefs IEEE Transactions on Circuits and System–II: Analog and Digital Signal Processing, vol. 39, No. 8, Aug. 1992, pp. 575–578.

Ian N. Robinson, Hewlett–Packard Laboratories, "Pattern–Addressable Memory", Jun. 1992, pp. 20–30.

Keikichi Tamaru, "The Trend of Functional Memory Development", Invited Paper Special Issue on LSI Memories, IEICE Trans. Electron., vol. E76–C, No. 11, Nov. 1993, pp. 1545–1554.

Takeshi Ogura, et al., "a 4–kbit Associative Memory LSI", IEEE Journal of Solid–State Circuits, vol. SC–20, No. 6, Dec. 1985, pp. 1277–1281.

Hiroshi Kadota, et al., "An 8–kbit Content–Addressable and Reentrant Memory", IEEE Journal of Solid–State Circuits, vol. SC–20, No.5, Oct. 1985, pp. 951–956.

Simon R. Jones, et al., "A 9–kbit Associative Memory for High–Speed Parallel Processing Applications", IEEE Journal of Solid State Circuits, vol. 23, No. 2, Apr. 1988, pp. 543–548.

Anthony J. McAuley, et al., "A Self–Testing Reconfigurable CAM", IEEE Journal of Solid State Circuits, vol. 26, No. 3, Mar. 1991, pp. 257–261.

KLSI, "Addres Processor" KE5B064H series–Dual Port and Fixed Table Type–, Version 1.0.1, published approximately late 1995 or early 1996, pp. 1–1 through 14–1.

KLSI, "KE5B064A1 Address Processor" Version 2.0.2, published approximately late 1995 or early 1996, pp. 1–1 through 12–1.

METHOD AND APPARATUS FOR CASCADING CONTENT ADDRESSABLE MEMORY DEVICES

FIELD OF THE INVENTION

The present invention relates generally to content addressable memory (CAM) devices.

BACKGROUND

A content addressable memory (CAM) device is a storage device that can be instructed to compare a specific pattern of comparand data with data stored in its associative CAM array. The entire CAM array, or segments thereof, are searched in parallel for a match with the comparand data. If a match exists, the CAM device indicates the match by asserting a match flag. Multiple matches may also be indicated by asserting a multiple match flag. The CAM device typically includes a priority encoder to translate the matched location into a match address or CAM index and outputs this address to a status register. The match address, the contents of the matched location, and other status information (e.g., skip bit, empty bit, full flag, as well as, match and multiple match flags) may be output from the CAM device to an output bus.

CAM devices may be depth cascaded together to form a larger CAM device or system. For example, two 1 k ×64 CAM devices may be depth cascaded together to form a 2 k×64 CAM. Depth cascading may be implemented using match flag input and output pins. A higher priority CAM device (i.e., the CAM device with a lower physical addresses) may have its match flag output pin connected to the match flag input pin of the lower priority CAM device (i.e. the CAM device with the higher physical addresses). In response to a compare instruction, each CAM device simultaneously compares compared data with data stored in its respective CAM array. If the higher priority CAM device has a match, it will notify this result to the lower priority CAM device by asserting its match flag output signal. The higher priority CAM device may then output its match address to a common output bus, and the lower priority CAM device will be disabled from outputting data to the common output bus. If, however, the higher priority CAM device does not have a match, it will not assert its match flag output and the lower priority CAM device may provide its match address to the common output data bus (if it has a match). If there are many CAM devices depth cascaded together, then the lowest priority CAM device in the cascade will only be able to output its data to the common output bus if no other CAM devices in the cascade have a match. That is, the lowest priority CAM device will have to wait until the match flag signals from the previous CAM devices have rippled through the depth cascade chain. This may result in undesirably long response times for the depth cascaded CAM system to respond to a compare instruction.

It may not be desirable to use only the match flag input and output pins when depth cascading CAM devices that operate in a flow-through mode. CAM devices that operate in a flow-through mode may be able to output a match address, data from a matched location in a CAM array, and other status information (e.g., match flag, multiple match flag, full flag, skip bit, empty bit, or a device identification) in a single clock cycle. For example, a higher priority CAM device that does not have a match will not assert its match flag during the single clock cycle. A lower priority CAM with a match will not know if it can output its match address to the common output data bus during the clock cycle because it does not know whether the higher priority CAM device has a slow response time, or whether the higher priorty CAM device does not have a match.

One possible solution may be to allow each of the CAM devices in the cascade to output its match address to the common output data bus and then allow each CAM device to be disabled appropriately when the match flag results ripple through the cascade. This solution, however, may result in a number of disadvantages, including: (1) causing bus contention problems, (2) causing an undesirable amount of power to be drawn by the system as potentially all CAM devices may be driving the common output data bus at the same time, and (3) slowing down the system as capacitance may be increased on the common output data bus.

Therefore, what is needed is a mechanism for depth cascading CAM devices that operate in a flow-through mode.

SUMMARY OF THE INVENTION

A method and apparatus for cascading content addressable memory (CAM) devices is disclosed. The method and apparatus may be particularly useful when depth cascading CAM devices that operate in a flow-through mode. In the flow-through mode, a compare instruction may be simultaneously provided to each CAM device in the cascade, and the match address, data stored at the matched location, or other status information may then be output to a common output data bus by the highest priority matching CAM device in the same cycle that the instruction is provided to the CAM devices. Each CAM device may have a cascade input and a cascade output to perform the cascade function. The cascade output of a higher priority CAM device may be connected to the cascade input of the next lower priority CAM device. The higher priority CAM device may assert a cascade signal on its cascade output at a predetermined time after receiving an input signal (e.g., a clock signal). Asserting the cascade signal may indicate that the higher priority CAM device has completed the compare instruction. When the lower priority CAM device detects that the cascade signal has been asserted on its cascade input, the lower priority CAM device may sample the match flag of the higher priority CAM device to determine if the lower priority CAM device may output its data to the common output data bus.

Other objects, features, and advantages of the present invention will be apparent from the accompanying drawings and from the detailed description which follows below.

BRIEF DESCRIPTION OF THE DRAWINGS

The features and advantages of the present invention are illustrated by way of example and are by no means intended to limit the scope of the present invention to the particular embodiments shown, and in which.

DETAILED DESCRIPTION

A method and apparatus for cascading content addressable memory (CAM) device is disclosed. In the following description, for purposes of explanation, specific nomenclature is set forth to provide a thorough understanding of the present invention. However, it will be apparent to one skilled in the art that these specific details may not be required to practice the present invention. In other instances, well known circuits and devices are shown in block diagram form to avoid obscuring the present invention unnecessarily. The interconnection between circuit elements or blocks may be shown as buses or as single signal lines. Each of the buses may alternatively be single signal lines, and each of the single signal lines may alternatively be buses. Additionally, signal or pin names preceded by the symbol "/" are active low signals or pins. However, these signals or pins may be alternatively be replaced with active high signals or pins.

The method and apparatus of the present invention may be particularly useful when depth cascading CAM devices that operate in a flowthrough mode. In the flow-through mode, a compare instruction may be simultaneously provided to each CAM device in the cascade, and the match address, data stored at the matched location, or other status information may then be output to a common output data bus by the highest priority matching CAM device in the same cycle that the instruction is provided to the CAM devices. Each CAM device may have a cascade input and a cascade output to perform the cascade function. The cascade output of a higher priority CAM device may be connected to the cascade input of the next lower priority CAM device. The higher priority CAM device may assert a cascade signal on its cascade output at a predetermined time after receiving an input signal (e.g., a clock signal). Asserting the cascade signal may indicate that the higher priority CAM device has completed the compare instruction. When the lower priority CAM device detects that the cascade signal has been asserted on its cascade input, the lower priority CAM device may sample the match flag of the higher priority CAM device to determine if the lower priority CAM device may output its data to the common output data bus.

Figure 1:
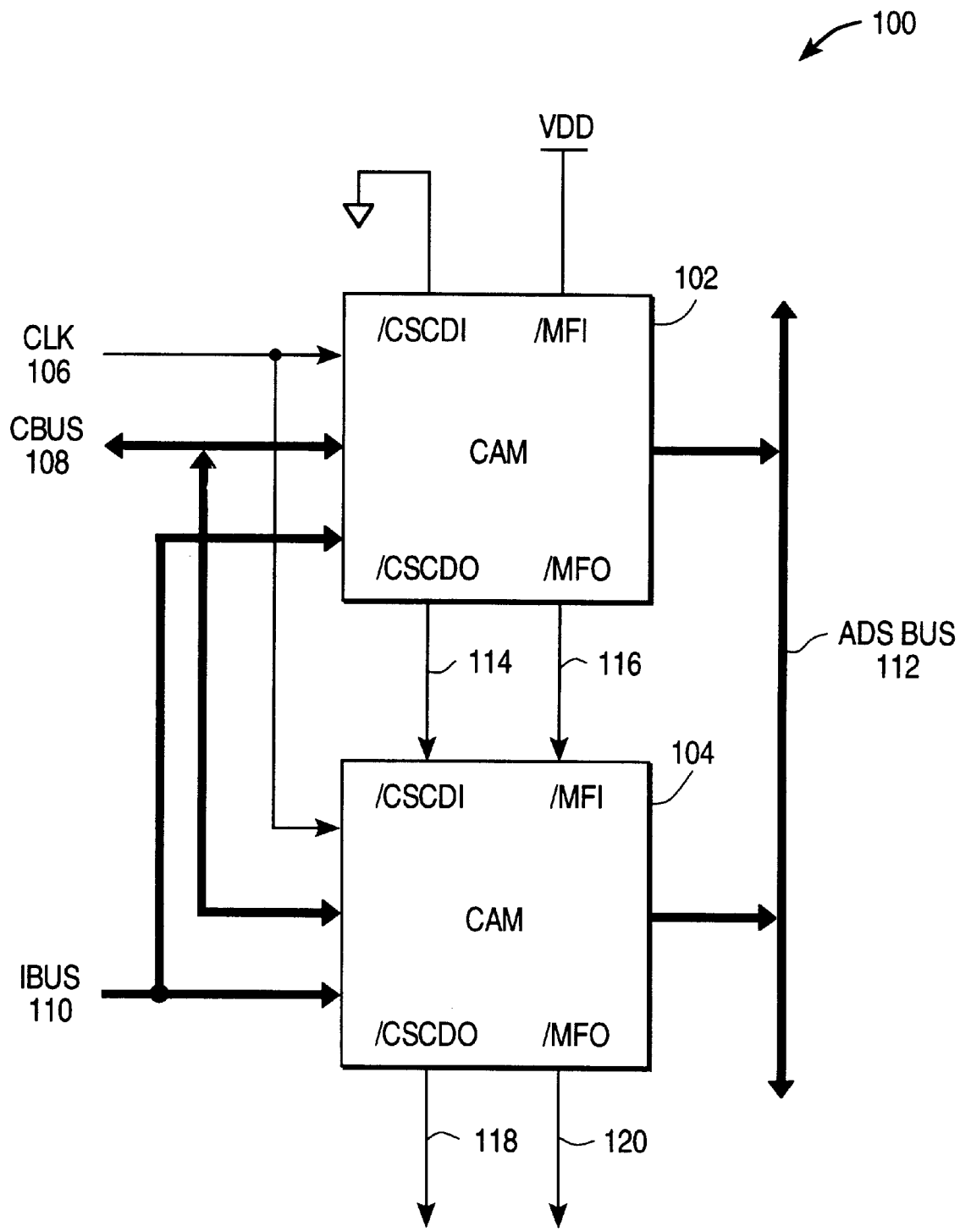
FIG. 1 is a block diagram of two CAM devices cascaded together in depth expansion according to one embodiment of the present invention.

FIG. 1 is a block diagram of system 100 that includes CAM devices 102 and 104 interconnected in a depth cascade configuration. The total memory size of system 100 may be larger than the individual sizes of CAMs 102 and 104. For example, if CAM 102 is a 4 k×64 CAM device and CAM 104 is a 1 k×64 CAM device, then system 100 may operate as a 5 k×64 CAM device. Any size of CAM devices may be used in the present invention. Also, CAMs of different widths may be cascaded together. For alternative embodiments, other memory devices besides CAM devices may also be used (e.g., SRAMs, multi-port RAMs, DRAMs, ROMs, EEPROMs, EPROMs, etc.). Additionally, system 100 may be formed from stand-alone CAM devices, or may be formed from integrated circuits on a common substrate.

Each CAM device receives in parallel clock signal CLK 106, comparand data from comparand bus CBUS 108, and instructions (e.g., write -and-compare or other compare instructions) from instruction bus IBUS 110. For alternative embodiments, CBUS 108 and IBUS 110 may be the same bus. Other input signals may also be simultaneously provided to each of CAMs 102 and 104 including word enables signals, a reset signal, a chip enable signal, and the like. CAMs 102 and 104 may also output data to a common associated data and status information bus ADS BUS 112. The data output from CAMs 102 and 104 to ADS BUS 112 may include a match address, data stored in the CAM devices, or status information including a match flag, multiple match flag, full flag, skip bit, empty bit, device identification information, and/or other information.

CAM devices 102 and 104 may each include a cascade input pin /CSCDI, a cascade output pin /CSCDO, a match flag input pin /MFI, and a match flag output pin /MFO. CAM device 102 may be designated as the higher priority CAM device by coupling its /CSCDI pin to a first power supply rail (e.g., ground or approximately zero volts), and coupling its /MFI pin to a second power supply rail VDD. For one embodiment, VDD may be from approximately 1.5 volts to approximately 7.0 volts. Other voltages may be used. CAM 102 may have its /CSCDO pin coupled to the /CSCDI pin of CAM 104 via line 114, and CAM 102 may have its /MFO pin coupled to the /MFI pin of CAM 104 via line 116. If more CAM devices are included in the depth cascade of system 100, then each CAM device may similarly have its /CSCDI pin coupled to the /CSCDO pin of the next highest priority (or next lowest priority) CAM device, and its /MFI pin coupled to the /MFO pin of the next highest priority (or next lowest priority) CAM device.

Figure 2:
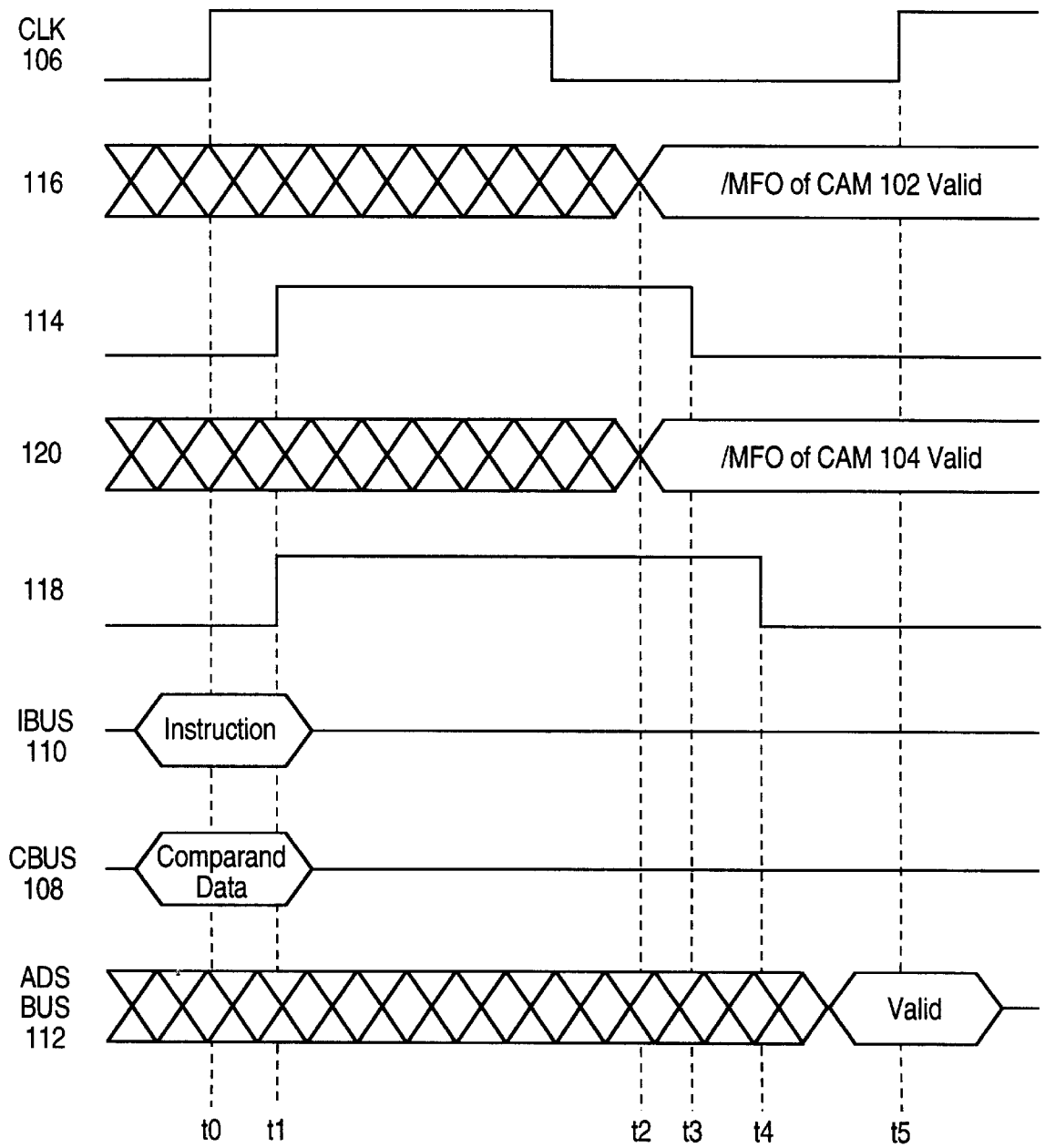
FIG. 2 is a timing diagram of one embodiment of the cascade signals generated by the CAM devices of FIG. 1.

The operation of system 100 may be illustrated with the aid of the illustrative timing diagram of FIG. 2. At time t0, CLK 106 transitions to a high state enabling CAMs 102 and 104 to load an instruction from IBUS 110 and comparand data from CBUS 108. The instruction may be an instruction that instructs CAMs 102 and 104 to compare the comparand data with data stored in CAM arrays of each of the CAM devices.

At time t1, CAMs 102 and 104 may each deassert (e.g., drive to a logic high state) their respective /CSCDO signals at their /CSCDO output pins. When CAM 102 deasserts its /CSCDO output pin and drives a high signal on line 114, CAM 104 may be disabled from asserting (e.g., driving to a logic low state) its /CSCDO output pin and from providing data to ADS BUS 112. CAM 102 (and CAM 104) may continue to deassert their respective /CSCDO output pins for a predetermined time sufficient to enable the instruction to be performed by the CAM device. For example, CAM 102 may deassert the signal on line 114 for a period of time sufficient for CAM 102 to compare the comparand data with data stored in its CAM array, and for CAM 102 to generate a match flag indicating the results of the compare instruction (e.g., at time 2). After these internal operations have been completed, CAM 102 may assert the /CSCDO signal on line 114 at line t3. CAM 102 may also deassert the signal on line 114 for a period of time sufficient for CAM 102 to generate a matching address, read data from the matching location of the CAM array of CAM 102, and/or to generate status information for the operation.

At time t3, CAM 104 receives the asserted /CSCDO on line 114 as a /CSCDI input signal and may use the assertion as an indicator that the match flag signal on line 116 is in a valid state. That is, the cascade output signal /CSCDO indicates when CAM 102 has completed performing the compare instruction and the match flag signal on line 116 is valid. If the match flag signal on line 116 is asserted (e.g., a logic low state) at time t3, higher priority CAM 102 has a match and CAM 104 will not output data to ADS BUS 112. If the match flag signal on line 116 is deasserted (e.g., a high logic state) at time t3, CAM 102 does not have a match and CAM 104 may output data to ADS BUS 112 by time t5 if CAM 104 has determined that there is a match between the comparand data and data stored in its CAM array. CAM 104 may output on line 118 /CSCDO at a time t4 after receiving the asserted /CSCDO signal on line 114 at time t3.

CAM 104 may also assert and deassert /MFO on line 120 irrespective of whether CAM 102 has a match. The /CSCDO signal on line 118 and the /MFO signal on line 120 may be generated for the benefit of any additional CAM devices that may be further depth cascaded with CAMs 102 and 104.

Figure 3:
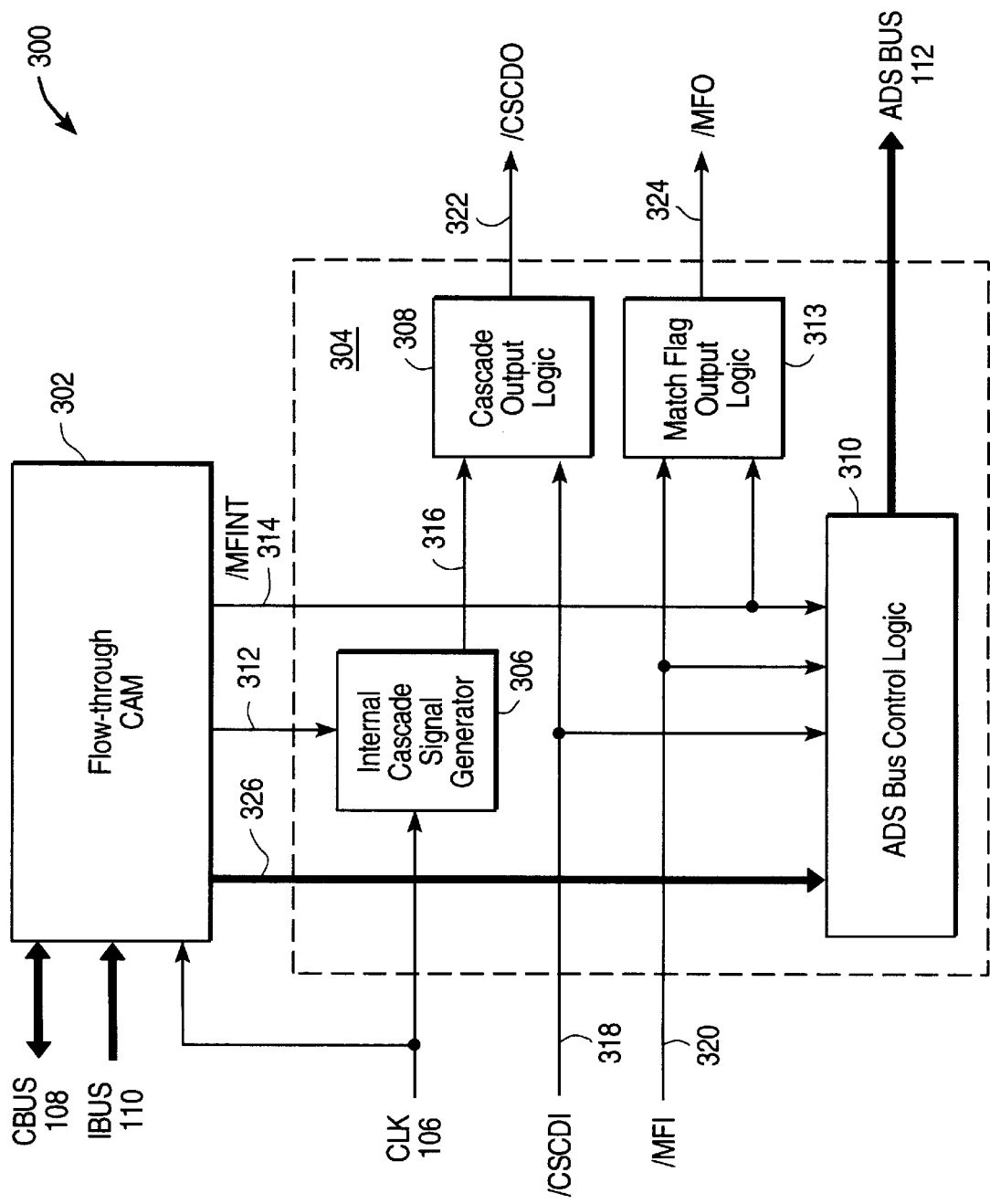
FIG. 3 is a block diagram of one embodiment of one of the CAM devices of FIG. 1 including flow-through circuitry and expansion circuitry.

FIG. 3 is a block diagram of CAM 300. CAM 300 is one embodiment of CAM 102 or CAM 104 of FIG. 1. CAM 300 includes flow-through CAM circuitry 302 and expansion circuitry 304. Flow-through CAM circuitry 302 includes circuitry necessary for CAM 300 to operate in a flow-through mode. For other embodiments, circuitry 302 may be CAM circuitry that does not operate in a flow-through mode. Expansion circuitry 304 may include internal cascade signal generator 306, cascade output logic 308, match flag output logic 313, and ADS BUS control logic 310.

CAM 300 may operate in a depth cascaded system as follows. In response to a write and compare or any other compare instruction on IBUS 110, flow-through CAM circuitry 302 may load in the comparand data for comparison with a first group of CAM cell in its CAM array. Plow-through CAM circuitry 302 may then send a signal on line 312 to indicate that a compare instruction is being performed by CAM 300. Internal cascade signal generator 306 may then deassert (or assert) a signal on line 316 for a predetermined period of time sufficient to enable flow-through CAM circuitry 302 to determine if there is a match between the comparand data and data stored in the CAM array of flow-through CAM circuitry 302. The internal cascade signal on line 316 (and/or /CSCDO on line 322) may also be generated for every instruction and not just a compare instruction. During the predetermined period of time that the signal on line 316 is deasserted, cascade output logic 308 may cause /CSCDO on line 322 to be deasserted. When /CSCDO on line 322 is deasserted, the next lowest priority CAM device in the cascade may be inhibited from providing data to ADS BUS 112 and/or from asserting its /CSCDO output signal.

For one embodiment, internal cascade signal generator 306 comprises a one-shot circuit that may deassert the signal on line 316 for the predetermined period of time in response to a rising edge (or falling edge) of CLK 106. Any one shot circuit may be used that can generate the signal on line 316 for the appropriate amount of time.

Flow-through CAM circuitry 302 may perform a comparison of the comparand data with a first group of CAM cell(s) in its CAM array. The results of the comparison may be reflected by the state of the internal match flag signals /MFINT on line 314. If there is no match with data stored in the CAM array and the comparand data, then /MFINT may be deasserted (e.g., to a high logic state) on line 314. If there is a match, then /MFINT may be asserted (e.g., to a low logic state) on line 314, and the match address of the location in the CAM array may be provided to bus 326. Match flag output logic 313 may then generate the output match flag signal /MFO on line 324 in response to /MFINT on line 314 and /MFI on line 320. For one embodiment, /MFO may be asserted if /MFINT is asserted.

The state of /MFO on line 324 may be resolved before the predetermined period of time has transpired for which the signal on line 316 is deasserted. That is, CAM 300 may assert /CSCDO on line 322 after /MFO is resolved or valid for the compare instruction. Thus, /CSCDO on line 322 may indicate when CAM 300 has completed comparing the comparand data with data stored in its CAM array, and when the results of /MFO on line 324 are valid.

If a match is determined, flow-through CAM circuitry 302 may sense data from the CAM array corresponding to the matched address, and may output the sensed data to ADS BUS control logic 310 via bus 326. ADS BUS control logic 310 may output the match address, the sensed data, and other status information to ADS BUS 112 if CAM 300 contains the highest priority match address. ADS BUS control logic 310 may determine if CAM 300 has the highest priority match address by monitoring the states of /CSCDI on line 318, /MFI on line 320, and/or /MFINT on line 314. If /MFI on line 320 is asserted, then a higher priority CAM device may have a match and ADS BUS control logic 310 may not output data to ADS BUS 112. If, however, /CSCDI on line 318 is asserted, /MFINT on line 314 is asserted, and /MFI on line 320 is deasserted, then ADS BUS control logic 310 may determine that CAM 300 has the highest priority match address and may output data to ADS BUS 112.

Figure 4:
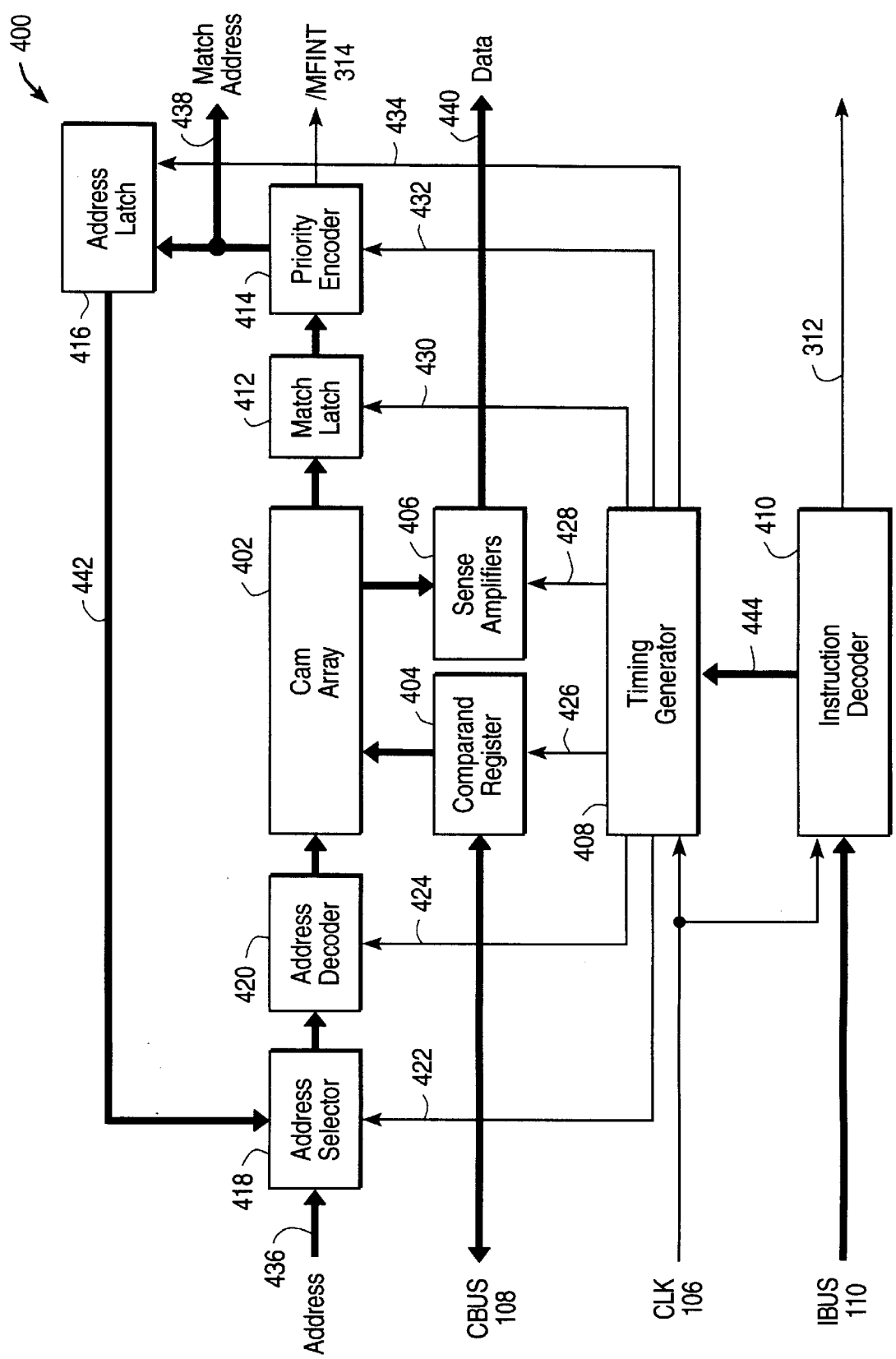
FIG. 4 is one embodiment of the flow-through circuitry of the CAM device of FIG. 3.

One embodiment of flow-through CAM circuitry 302 is disclosed in U.S. patent application Ser. No. 08/967,314, entitled SYNCHRONOUS CONTENT ADDRESSABLE MEMORY WITH SINGLE CYCLE OPERATION filed on Oct. 30, 1997 which is hereby incorporated by reference. FIG. 4 shows one embodiment of the flow-through CAM circuitry 400 disclosed in application Ser. No. 08/967,314. Flow-through CAM circuitry 400 is one embodiment of flow-through CAM circuitry 302 of FIG. 3. Flow-through CAM circuitry 400 may include CAM array 402, comparand register 404, sense amplifiers 406, timing generator 408, instruction decoder 410, match latch 412, priority encoder 414, address latch 416, address selector 418, and address decoder 420. Flow-through CAM circuitry 400 may also include a clock buffer for CLK 106 and for providing one or more clock signals of the same or varying phases or frequencies to timing generator 408 and/or instruction decoder 410.

Flow-through CAM circuitry 400 may perform a compare instruction in one (or more) cycles as follows. At the start of a clock cycle of CLK 106, instruction decoder 410 decodes a write and compare (or compare) instruction on IBUS 110. Instruction decoder 410 decodes the instruction and sends a signal on bus 444 to timing generator 408 indicating the nature of the instruction. Instruction decoder 410 may also output a signal on line 312 that may be coupled to internal cascade signal generator 306 as shown in FIG. 3.

In response to the signal on line 444, timing generator 408 sends a signal on line 426 to cause the comparand data on CBUS 108 to be loaded into comparand register 404. The comparand data may then be compared with data stored in CAM array 402 to determine if there is a match. The states of match lines in CAM array 104 may then be latched by match latch 412 in response to a signal on line 430. Priority encoder 116 may then latch the output of match latch 412 in response to a signal on line 432. Priority encoder 414 may determine the highest priority match address from the comparison. The match address may then be output by priority encoder 414 to bus 438, and may be latched by address latch 416 (to bus 442) in response to a signal on line 434. Bus 438 may be a part of bus 326 of FIG. 3. As generally known in the art, priority encoder 116 may also generate an internal match flag signal /MFINT on line 314 if there is at least one match between the comparand data and the data stored in CAM array 402. The match address on bus 442 may then be provided to address decoder 420 by address selector 418 in response to a signal on line 422. Address selector 418 may couple either the address on address bus 436 or the match address on bus 442 to address decoder 420. For an alternative embodiment, address selector 418 may be omitted and bus 442 may be directly connected to address decoder 420. Address decoder 420 may decode the match address and output the decoded match address in response to a signal on line 424. The decoded match address may select a row of CAM cells in CAM array 402 corresponding to the match address. One or more CAM cells at the high priority match address may then be sensed by sense amplifiers 406 and coupled to bus 440. Bus 440 may be a part of bus 326 of FIG. 3. Before the end of the clock cycle(s) of CLK 106, the match address on bus 438, the internal match flag on line 314, and the sensed data from CAM array 402 may be provided to expansion circuitry.

Figure 5:
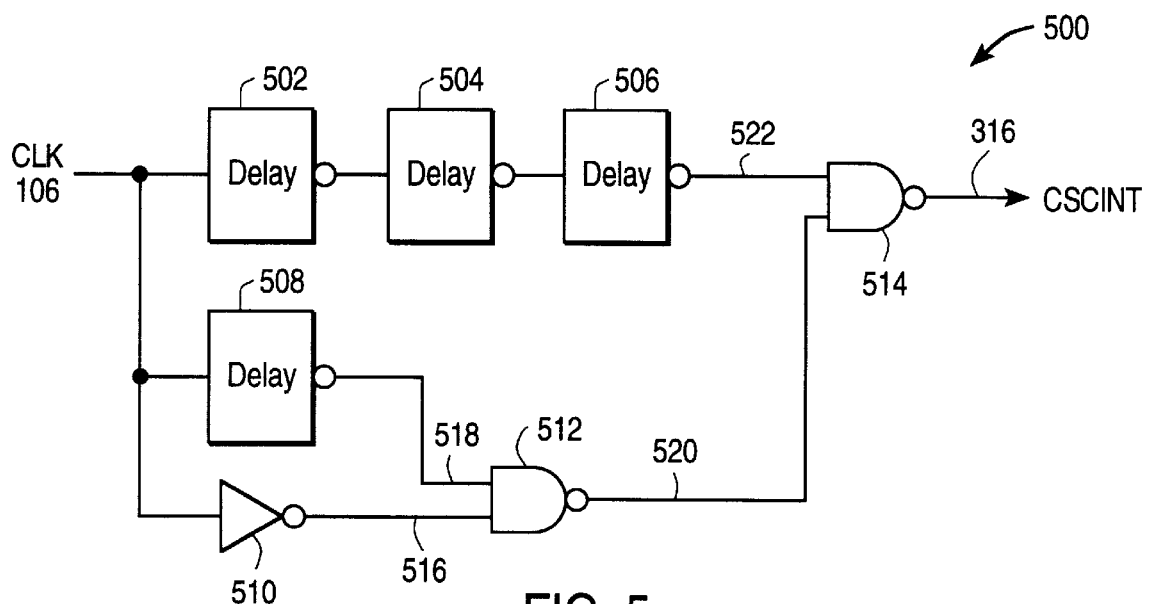
FIG. 5 is a logic diagram of one embodiment of the internal cascade signal generator of FIG. 3.

FIG. 5 is a logic diagram of internal cascade signal generator 500. Internal cascade signal generator 500 is one embodiment of internal cascade signal generator 306 of FIG. 3 and generates CSCINT on line 316 for a predetermined period of time sufficient for CAM 300 to generate /MFINT on line 314. Other embodiments for internal cascade signal generator 306 may be used.

Generator 500 is a one-shot circuit that may have a first delay path including inverting delay elements 502, 504, and 506 coupled in series between CLK 106 and the first input of NAND gate 514. Any odd number of inverting delay elements may be used. For an alternative embodiment, any combination of inverting and/or non-inverting delay elements may also be used. Additionally, each delay element may have the same amount of delay or different amounts of delay. For one embodiment, delay elements 502 and 504 have approximately the same amounts of delay, and delay element 506 has a different amount of delay. The total amount of delay through delay element 502, 504, and 506 may be sufficient to cause NAND gate 514 to deassert CSCINT on line 316 for a sufficient amount of time such that flowthrough circuitry 302 resolves /MFINT on line 314. Each delay element may include a resistor, RC network, inverter, or other delay circuitry.

Generator 500 may also include a second delay path that may include inverting delay element 508, inverter 510 and NAND gate 512. Inverting delay element 508 may have its input coupled to CLK 106 and its output coupled to the first input of NAND gate 512. inverter 510 may have its input coupled to CLK 106 and its output coupled to the second input of NAND gate 512. The output of NAND gate 512 may be coupled to the second input of NAND gate 514. The output of NAND gate 514 may provide the internal cascade signal CSCINT on line 316. Delay element 508 may comprise the same delay element as any of delay elements 502, 504, or 506.

Figure 6:
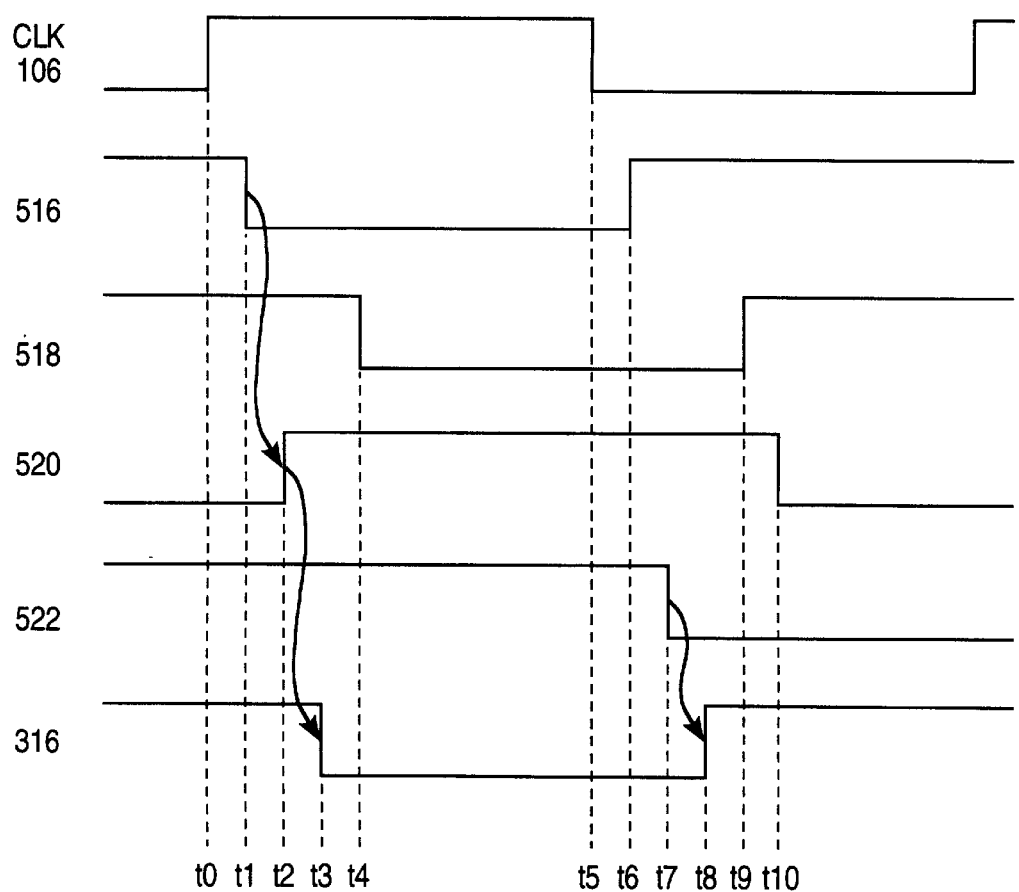
FIG. 6 is a timing diagram for the logic diagram of FIG. 5.

The operation of generator 500 may be described with the aid of the illustrative timing diagram of FIG. 6. At time t0, CLK 106 transitions to a high state causing the signal on line 516 to transition to a low state at time t1 and the signal on line 520 to transition to a high state at time t2. The low signal on line 520 will cause CSCINT on line 316 to be deasserted and transition to a low state at time t3. After a delay through delay element 508, the signal on line 518 will also transition to a low state at time t4. After a delay through delay elements 502, 504, and 506, the signal on line 522 will transition to a low state at time t7 and cause NAND gate 514 to assert CSCINT to a high state at time t8. Thus, CSCINT may be deasserted for a predetermined amount of time from time t3 to time t8. It will be appreciated that the second delay path may function to not allow the falling edge of CLK 106 at time t5 to assert CSCINT on line 316 before the rising edge of CLK 106 has propagated through the first delay path of delay element 502, 504, and 506.

For an alternative embodiment, the signal on line 312 of FIG. 3 may be used to gate CLK 106 into delay elements 502 and 508 and inverter 510. For example, CLK 106 may be logically ANDed with the signal on line 312. For yet another embodiment, CSCINT on line 316 may be gated with the signal on line 312 before coupling CSCINT to cascade output logic 308 of FIG. 3. For example, CSCINT may be logically ANDed with the signal on line 312.

Figure 7:
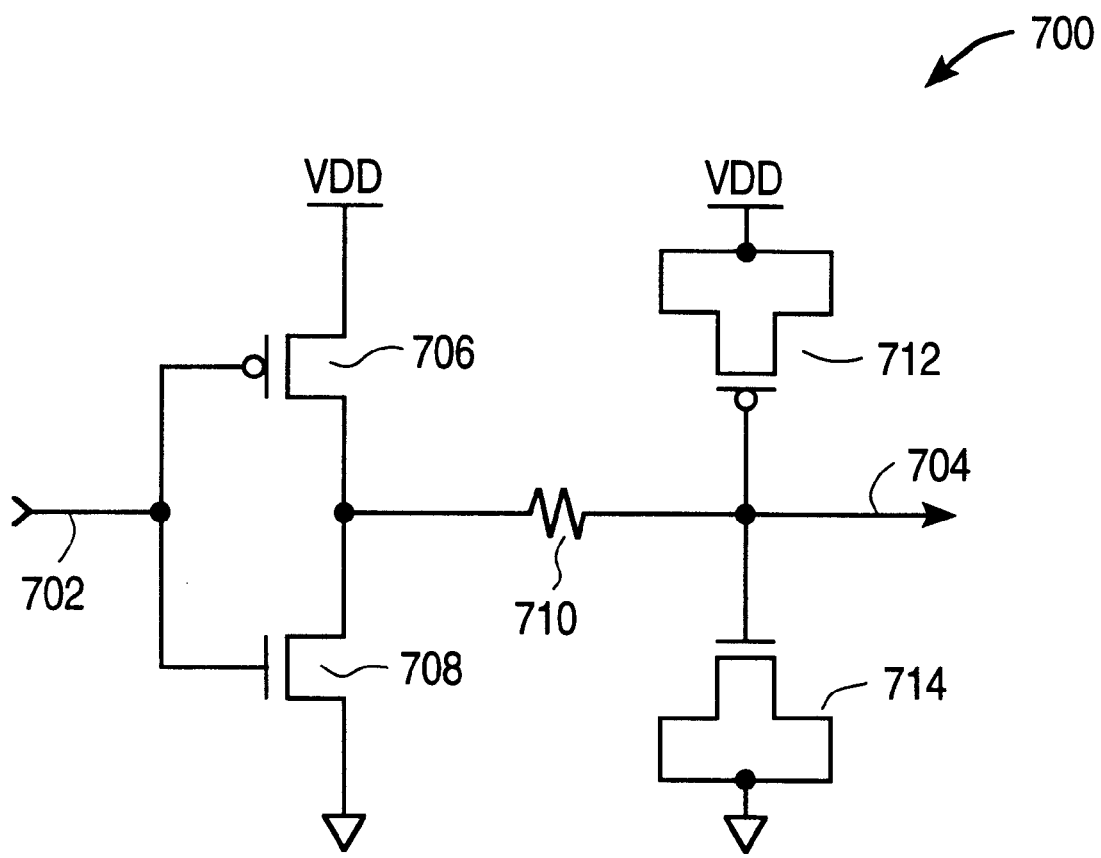
FIG. 7 is a circuit diagram of one embodiment of a delay circuit of FIG. 6.

FIG. 7 is a circuit diagram of delay element 700. Delay element 700 is one embodiment any of delay circuits 502, 504, 506, or 508 of FIG. 5. Delay element 700 includes a CMOS inverter formed by PMOS transistor 706 and NMOS transistor 708. Any other inverter in any other process technology may also be used. The inverter inverts the signal at line 702 and couples the inverted signal to line 704 after a delay caused by resistor 710 and capacitors 712 and 714. Resistor 710 may be of any size. For one embodiment, resistor 710 is approximately from 100 ohms to approximately 1 kohms. Resistor 710 is optional. One, both, or none of capacitors 712 and 714 may be included in delay element 700. Capacitor 712 may be formed from a PMOS transistor, and capacitor 714 may be formed from an NMOS transistor. For one embodiment, capacitor 712 may have a width-to-length ratio of approximately 3.2 microns ($\mu$m) to approximately 7.8 $\mu$m, and capacitor 714 may have a width-to-length ratio of approximately 7.8 $\mu$m to approximately 3.2 $\mu$m.

Figure 8:
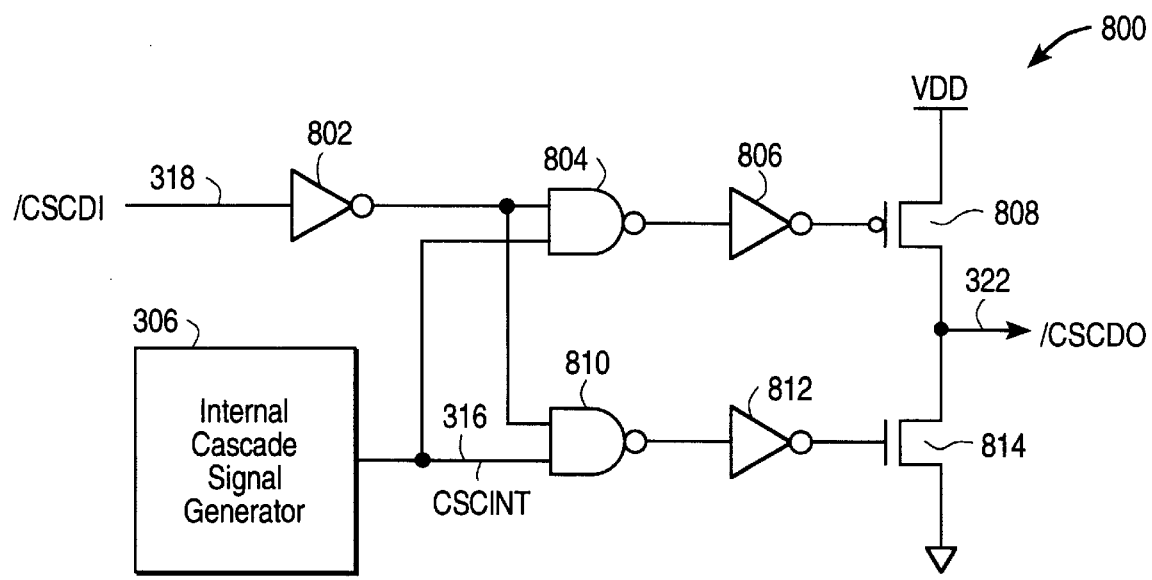
FIG. 8 is a logic diagram of one embodiment of the cascade output logic of FIG. 3.

FIG. 8 is a logic diagram of cascade output logic 800. Cascade output logic 800 is one embodiment of cascade output logic 308 of FIG. 3. Other embodiments for cascade output logic 308 may be used.

Cascade output logic 800 may include NAND gates 804 and 810, inverters 802, 806, and 812, PMOS transistor 808, and NMOS transistor 814. Inverter 802 has its input coupled to /CSCDI on line 318 and its output coupled to the first inputs of NAND gates 804 and 810. NAND gates 804 and 810 each have their second inputs coupled to CSCINT on line 316. Inverter 806 has its input coupled to the output of NAND gate 804, and its output coupled to the gate of PMOS transistor 808. Inverter 812 has its input coupled to the output of NAND gate 810, and its output coupled to the gate of NMOS transistor 814. PMOS transistor 808 further has its source coupled to a power supply rail VDD, and its drain coupled to /CSCDO at line 322. NMOS transistor 814 further has its drain coupled to line 322, and its source coupled to rail ground or approximately zero volts.

Figure 9:
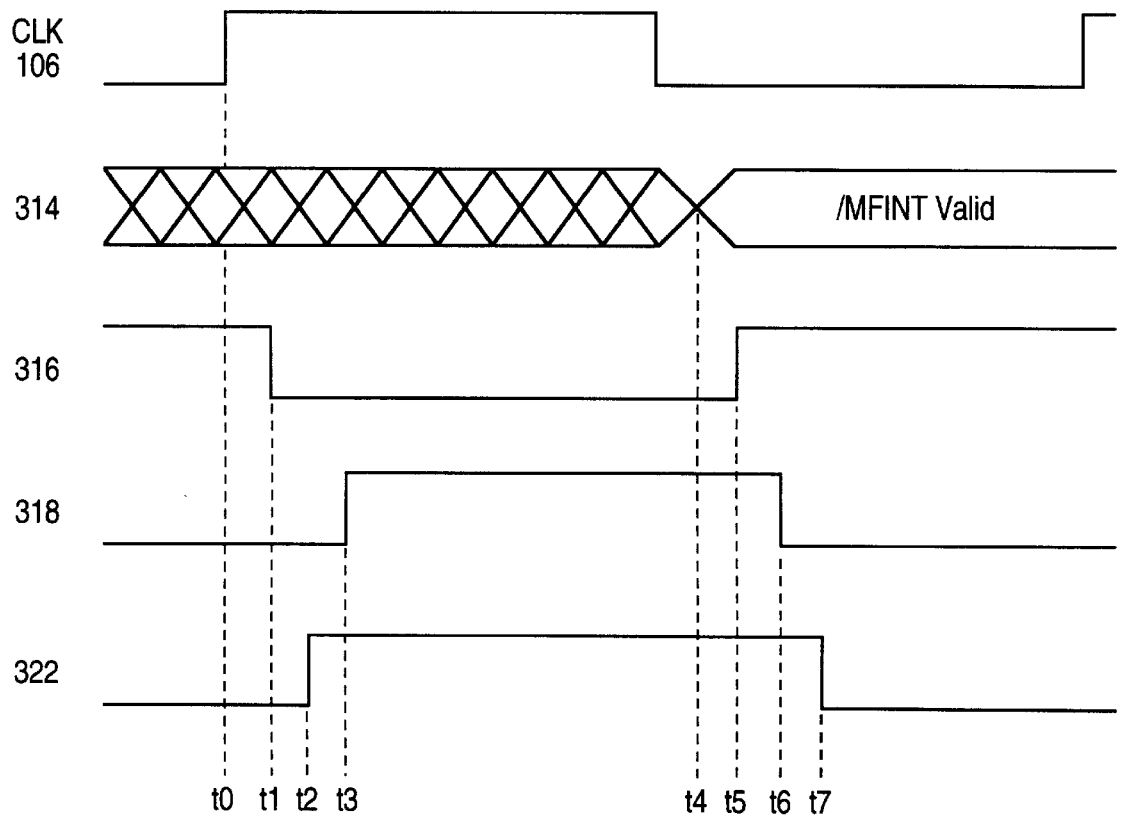
FIG. 9 is a timing diagram for the logic diagram of FIG. 8.

The operation of cascade output logic 800 may be illustrated with reference to FIG. 3 and the aid of the illustrative timing diagram of FIG. 9. Assume that cascade output logic 800 is included in a lower priority CAM device such as CAM 104 of FIG. 1. When the compare instruction is loaded into the CAM device in response to the rising edge of CLK 106 at time t0, internal cascade signal generator 306 may then generate a one-shot signal on line 316 from time t1 to t5. This may cause /CSCDO on line 322 to transition to a high state at time t2 as PMOS transistor 808 may be on and NMOS transistor 814 may be off. /CSCDI on line 318 may transition to a high state at time t3. The one-shot signal on line 316 may transition to a high state after the internal match flag signal on line 314 has transitioned to a valid state at time t4. When /CSCDI on line 318 is asserted to a low state indicating that the higher priority CAM device has completed its comparison operation, PMOS transistor 808 will be turned off and NMOS transistor 814 will be turned on to pull /CSCDO on line 322 to a low state. The low state on line 322 may indicate that CAM 300 has completed its comparison operation and the match flag output signal /MFO on line 324 is valid.

Figure 10:
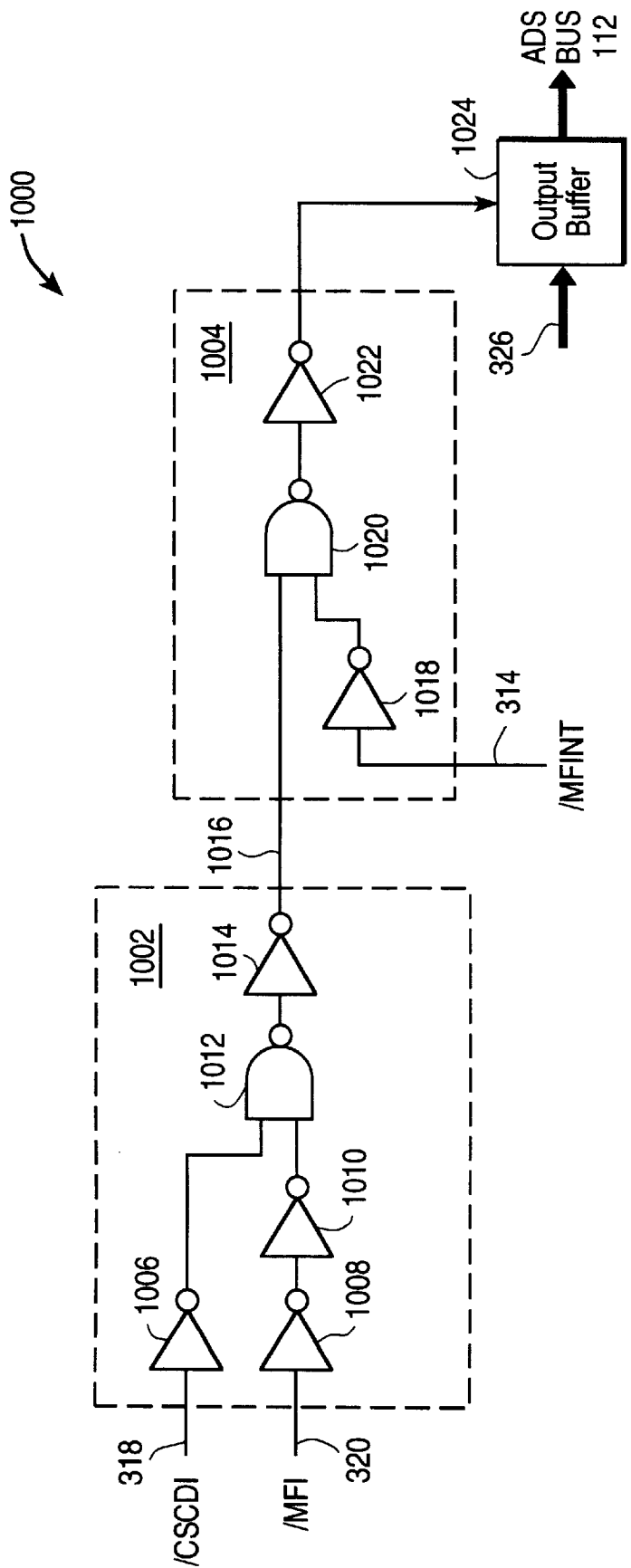
FIG. 10 is a logic diagram of one embodiment of the ADS bus control logic of FIG. 3.

FIG. 10 is a logic diagram of ADS BUS control logic 1000. ADS BUS control logic 1000 is one embodiment of the ADS bus control logic 310 of FIG. 3. Other embodiments for ADS bus control logic 310 may be used.

ADS BUS control logic 1000 may include match flag validating circuitry 1002, output enable control circuitry 1004, and output buffer 1024. Match flag validating circuitry 1002 may include NAND gate 1012 having its first input coupled to the logical complement of /CSCDI via inverter 1006, and its second input coupled to /MFI via series connected inverters 1008 and 1010. Match flag validating circuitry 1002 may then provide the logical complement of NAND gate 1012 to line 1016 via inverter 1014. For an alternative embodiment, NAND gate 1012 may be replaced with an AND gate and inverters 1008, 1010, and 1014 may be removed. Match flag validating control circuitry 1002 outputs the state of /MFI on line 1016 only when /CSCDI is asserted to a low state on line 318.

Output enable control circuitry 1004 may include NAND gate 1020 that has its first input coupled to line 1016, and its second input coupled to the logical complement of /MFINT via inverter 1018. Inverter 1022 may couple the logical complement of NAND gate 1020 to output buffer 1024. When /MFINT on line 314 is deasserted to a high state indicating no match for the comparison operation, output enable control circuitry 1004 may disable output buffer 1024 such that no data is provided from bus 326 to ADS BUS 112. Output enable control circuitry 1004 may enable output buffer 1024 to output data from bus 326 to ADS BUS 112 when: (1) MFINT on line 314 is asserted to a low state indicating a match; and (2) /MFI on line 320 is high indicating that no higher priority CAM device has a match. Output buffer 1024 may be any output buffer including a three-state output buffer that buffers signals from bus 326 to ADS BUS 112.

Figure 11:
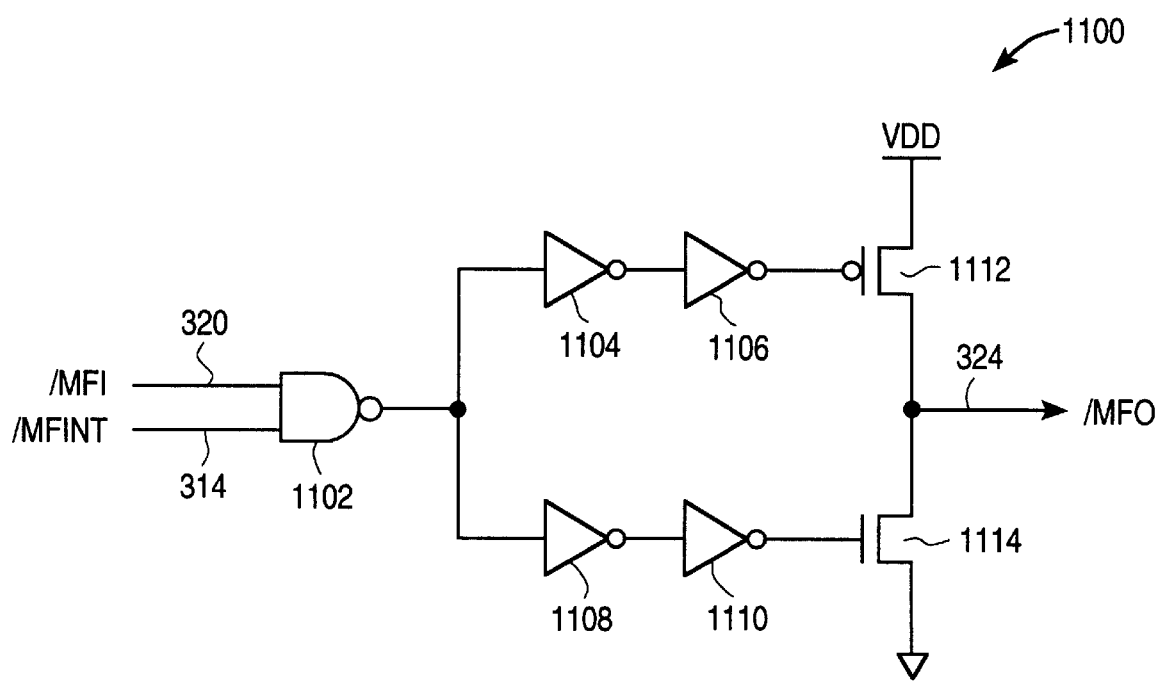
FIG. 11 is one embodiment of the match flag output logic of FIG. 3.

FIG. 11 is a logic diagram of the match flag output logic 1100. Match flag output logic 1100 is one embodiment of match flag output logic 313 of FIG. 3. Match flag logic 1100 may include NAND gate 1102, inverters 1104, 1106, 1108, and 1110, PMOS transistor 1112, and NMOS transistor 1114. For an alternative embodiment, inverters 1104, 1106, 1108, and 1110 may be omitted. NAND gate 1102 has its first input coupled to /MFI on line 320, and its second input coupled to /MFINT on line 314. The output of NAND gate 1102 is coupled to the gate of PMOS transistor 1112 via the series connected inverters 1104 and 1106. The output of NAND gate 1102 is also coupled to the gate of NMOS transistor 1114 via series connected inverters 1108 and 1110. PMOS transistor 1112 further has its source coupled to VDD and its drain coupled to /MFO at line 324. NMOS transistor 1114 further has its drain coupled to line 324 and its source coupled to ground or approximately zero volts. /MFO will only be deasserted to a high state if neither /MFI or /MFINT is asserted to a low state. This embodiment may be used in depth cascade systems that generate a composite match flag from the lowest priority CAM device in the cascade. Other embodiments for match flag output logic 313 of FIG. 3 may be used.

With reference to FIG. 1, an alternative embodiment for generating /CSCDO on line 114 (or line 118) may be to generate an internal match flag signal from an extra row of memory cells in the CAM array of CAM 102 (or CAM 104). The extra row may be appropriately masked to always generate a match condition that may then be provided out to /CSCDO on line 114. In this manner, CAM 104 may always see /CSCDI transition states and may then know when to sample /MFO on line 116.

In the foregoing specification the invention has been described with reference to specific exemplary embodiments thereof. It will, however, be evident that various modifications and changes may be made thereto without departing from the broader spirit and scope of the invention. The specification and drawings are, accordingly, to be regarded in an illustrative rather than restrictive sense.

What is claimed is:

1. A content addressable memory (CAM) device comprising:
    a CAM circuit for storing data;
    data inputs for providing comparand data for comparison with the data of the CAM circuit;
    a cascade circuit coupled to the CAM circuit;
    a match flag output coupled to the cascade circuit, the match flag output for providing a match flag output signal indicative of whether the comparand data matches the data of the CAM circuit; and
    a cascade output coupled to the cascade circuit, the cascade output for providing a cascade output signal indicative of when the match flag output signal is valid.

2. The CAM device of claim 1, further comprising a cascade input coupled to the cascade circuit, the cascade input for receiving a cascade input signal from another CAM device indicative of when the other CAM device has completed a compare operation.

3. The CAM device of claim 2, further comprising a match flag input coupled to the cascade circuit, the match flag input for receiving a match flag input signal from the other CAM device, wherein the cascade input signal from the other CAM device further indicates when the match flag input signal from the other CAM device is valid.

4. The CAM device of claim 3, wherein the CAM circuit outputs an internal match flag signal indicative of whether the comparand data matches the data of the CAM circuit, and wherein the CAM device further comprises match flag output logic coupled to receive the internal match flag signal and coupled to the match flag input, wherein the match flag output logic is configured to generate the match flag output signal in response to the match flag input signal and the internal match flag signal.

5. The CAM device of claim 4, further comprising bus control logic coupled to the CAM circuit, the cascade input, and the match flag input, the bus control logic configured to output an address from the CAM device corresponding to the data of the CAM circuit that matches the comparand, the bus control logic configured to output the address in response to the match flag input signal, the cascade input signal and the internal match flag signal.

6. The CAM device of claim 2, wherein the cascade circuit comprises:
a cascade signal generator configured to output an internal cascade signal in response to an input signal; and
cascade output logic coupled to the cascade signal generator and the cascade input the cascade output logic configured to generate the cascade output signal in response to the internal cascade signal and the cascade input signal.

7. The CAM device of claim 1, further comprising a clock input coupled to the cascade circuit, the clock input for receiving a clock signal.

8. The CAM device of claim 7, wherein the match flag output signal and the cascade output signal are generated by the cascade circuit in a single clock cycle of the clock signal.

9. The CAM device of claim 1, further comprising an instruction decoder coupled to the CAM circuit.

10. The CAM device of claim 9, further comprising a timing generator coupled to the CAM circuit and the instruction decoder.

11. A content addressable memory (CAM) device comprising:
a CAM circuit for storing data;
data inputs for providing comparand data for comparison with the data of the CAM circuit, a cascade circuit coupled to the CAM circuit;
a match flag input coupled to the cascade circuit, the match flag input for receiving a match flag input signal from another CAM device; and
a cascade out coupled to the cascade circuit, the cascade input for receiving a cascade input signal from the other CAM device indicative of when the match flag input signal from the other CAM device is valid.

12. The CAM device of claim 11, wherein the cascade circuit is further configured to generate a match flag output signal indicative of whether the comparand data matches the data of the CAM circuit.

13. The CAM device of claim 12, wherein the cascade circuit is further configured to generate a cascade output signal that indicates when the match flag output signal is valid.

14. The CAM device of claim 12 a clock input coupled to the cascade circuit and the CAM circuit, the clock input for receiving a clock signal, wherein the cascade output signal and the match flag output are generated by the cascade circuit in a single cycle of the clock signal.

15. The CAM device of claim 11, wherein the cascade circuitry comprises:
a cascade signal generator configured to output an internal cascade signal in response to an input signal; and
cascade output logic coupled to the cascade signal generator, the cascade output logic configured to generate the cascade output signal in response to the internal cascade signal and a cascade input signal to the CAM device.

16. The CAM device of claim 15, wherein the the cascade signal generator comprises a one-shot circuit.

17. The CAM device of claim 11, further comprising bus control logic coupled to the CAM circuit, the cascade input, and the match flag input, the bus control logic configured to output an address from the CAM device corresponding to the data of the CAM circuit that matches the comparand, the bus control logic configured to output the address in response to the match flag input signal, the cascade input signal and the internal match flag signal.

18. A system comprising:
a first content addressable memory (CAM) device having a cascade output and a match flag output, the match flag output for providing a match flag output signal indicative of whether comparand data matches data of the first CAM device, the cascade output for providing a cascade output signal indicative of when the match flag output signal is valid; and
a second content addressable memory (CAM) device coupled in a depth cascade configuration with the first CAM device, the second CAM device having a cascade input, a match flag input, and a cascade output, the cascade input of the second CAM device coupled to the cascade output of the first CAM device, the match flag input of the second CAM device coupled to the match flag output of the first CAM device.

19. The system of claim 18, wherein the system is incorporated into an integrated circuit.

20. The system of claim 18, wherein the second CAM device is configured to assert a cascade output signal to a logic state on its cascade output a predetermined amount of time after it receives at its cascade input the cascade output signal from the first CAM device asserted to the logic state.

21. The system of claim 20, wherein the first and second CAM device each have data outputs coupled to a common data output bus.

22. The CAM device of claim 21, wherein the cascade signal generator comprises a one-shot circuit.

23. The system of claim 21, wherein each CAM has data inputs coupled to a common data input bus, and wherein each CAM device is configured to simultaneously determine whether the comparand data provided on the data input bus data matches data of the respective CAM device.

24. The system of claim 23, wherein the second CAM device is configured to outputs its address of the matching data to the common data output bus if the first CAM device does not have a match.

25. The system of claim 24, wherein the second CAM device is configured to determine whether the comparand data provided on the data input bus data matches data of the CAM device in the same clock cycle of the clock signal that the second CAM is configured to outputs its address of the matching data to the common data output bus.

26. A method of depth cascading first and second content addressable memory (CAM) devices comprising:
instructing the first and second CAM devices to execute a compare operation between comparand data and first data stored in the first CAM device and second data stored in the second CAM device;
providing a match flag signal from the first CAM device to the second CAM device, the match flag signal indicating whether the comparand data matches the first data; and
providing a cascade output signal from the first CAM device to the second CAM device, the cascade output signal indicating when the the match flag signal is valid for sampling by the second CAM device.

27. The method of claim 26, wherein the first and second memory devices have outputs coupled to a common output bus, and further comprising only the first CAM device outputting data to the common output bus when the comparand data matches the first data.

28. The method of claim 27, wherein the method is performed by the CAM devices in one clock cycle.

29. The method of claim 27, further comprising only the second CAM device outputting data to the common output bus when the comparand data matches the second data stored and does not match the first data.

30. The method of claim 29, wherein the method is performed in one clock cycle.

31. A method of operating a content addressable memory (CAM) device comprising:

instructing the CAM device to execute a compare operation between comparand data and data stored in the CAM device;

generating a match flag signal from the CAM device, the match flag signal indicatative of whether the comparand data matches the data stored in the CAM device; and generating an output signal from the CAM device, the output signal indicating when the the match flag signal is valid.

* * * * *